United States Patent [19]

Chang et al.

[11] 3,844,790

[45] Oct. 29, 1974

[54] PHOTOPOLYMERIZABLE COMPOSITIONS WITH IMPROVED RESISTANCE TO OXYGEN INHIBITION

[75] Inventors: Catherine Teh-Lin Chang, Claymont; Joseph John Sheeto, Jr.; Jacob Beutel, both of Wilmington, all of Del.

[73] Assignee: E. I. du Pont de Nemours and Company, Wilmington, Del.

[22] Filed: June 2, 1972

[21] Appl. No.: 258,951

[52] U.S. Cl. .................... 96/86 P, 96/67, 96/87 R, 96/115 P

[51] Int. Cl. ...... G03c 1/68, G03c 1/76, G03c 1/94, G03c 1/78

[58] Field of Search ............. 96/115 P, 86 P, 115 R

[56] References Cited

UNITED STATES PATENTS

| | | | |
|---|---|---|---|
| 3,479,185 | 11/1969 | Chambers | 96/115 P |
| 3,549,367 | 12/1970 | Chang et al. | 96/115 P |
| 3,615,455 | 10/1971 | Laridon | 96/115 P |
| 3,647,467 | 3/1972 | Grubb | 96/115 P |
| 3,652,275 | 3/1972 | Baum et al. | 96/115 P |

*Primary Examiner*—Ronald H. Smith
*Assistant Examiner*—Richard L. Schilling

[57] ABSTRACT

Photopolymerizable compositions and layers containing an ethylenically unsaturated compound capable of free-radical addition polymerization, having improved photographic speed and improved resistance to oxygen inhibition, are obtained by using as a photoinitiating system a hexaarylbiimidazole and a cyclic, tertiary, hydrogen-donor compound. The process comprises exposing the layers imagewise and photopolymerizing the exposed areas. The compositions are useful in the graphic arts, e.g., for relief or planographic printing plates, photoresists, copying films, and the like.

12 Claims, No Drawings

PHOTOPOLYMERIZABLE COMPOSITIONS WITH IMPROVED RESISTANCE TO OXYGEN INHIBITION

BACKGROUND OF THE INVENTION

1. Field of the Invention

This invention pertains to photopolymerizable compositions, elements, and processes of photopolymerization. More particularly, it pertains to such compositions, elements and processes that yield an image in a photosensitive layer by a photohardening or photopolymerizing step.

2. Description of the Prior Art

The art is familiar with compositions that undergo photohardening upon exposure to actinic radiation. Photohardening involves changes in various physical properties of the compositions. These changes may include: an increase in hardness, tensile strength, or viscosity; a decrease in swelling, solubility, or sensitivity to attack by solvents; and an increase in melting point or flow temperature. These effects are usually accomplished by photochemical reactions in which new chemical bonds are formed through photo-induced polymerization and/or cross-linking. Compositions of this kind and their use as photosensitive layers or elements are disclosed in a number of patents, among which may be mentioned as representative U.S. Pat. Nos. 2,760,863, 2,791,504, 2,927,022, 2,951,758, 3,261,686, 3,380,831, 3,418,118, 3,418,295, 3,448,089, and 3,495,987.

When such compositions are used as the photosensitive layer in photographic elements, they provide a system that is "negative working" in the customary sense of that term in the art. That is, the areas of the layer that are exposed (e.g., through the transparent portions of a process transparency) are photohardened, whereas the complementary, adjoining areas of the layer (e.g., those masked by the opaque portions of the transparency) are relatively unchanged and are generally removed by such procedures as solvent washout or thermal transfer. The image formed in the photohardenable layer is thus an inversion or reciprocal of the original, i.e., a negative original will produce a positive image in the photohardenable layer and vice versa. It is, of course, possible to produce "positive working" final copies from such systems by such means as the thermal transfer processes described in U.S. Pat. Nos. 3,060,023, 3,060,024, and 3,060,025 wherein the underexposed (i.e., non-photohardened) portion of the layer is transferred to a separate receptor sheet, or by non-thermal separation of the underexposed portion on an integral receptor sheet as described in U.S. Pat. No. 3,353,955. However, insofar as the image originally produced in the photohardenable layer is concerned, these are still negative-working systems.

Preferred photopolymerization initiators, particularly because they impart high speed to the photosensitive composition and also because the photosensitivity is less inhibited by oxygen, are the hexaarylbiimidazole/free radical producing, electron donor agent combinations as described in Chambers, U.S. Pat. No. 3,479,185; Chang et al., U.S. Pat. No. 3,549,367; Fan, U.S. Pat. No. 3,558,322; Cescon et al., U.S. Pat. No. 3,615,454; Baum et al., U.S. Pat. No. 3,652,275; and Grubb, U.S. Pat. No. 3,647,467.

Although the above patents disclose technically and commercially promising compositions, and although they are described as being inhibited less by oxygen's presence (see Chang et al., U.S. Pat. No. 3,549,367, Col. 2, Lines 25–26), still further improvements in speed and reduced sensitivity to oxygen are desirable.

The inhibitory effect of oxygen on photopolymerization is well known in the art; an excellent summary on oxygen inhibition was published by Walker et al., in "The Journal of Photographic Science," Vol. 18, pages 150–158, 1970. As indicated therein, particularly on page 154, photopolymerization is divided into two sections: the induction period and the actual polymerization. During the induction period, oxygen, which inhibits polymerization, is chemically consumed. After the bulk of the oxygen has been removed, polymerization can begin. Thus, the presence of oxygen reduces the speed of photopolymer films and can also lead to poor resolution since diffusion of oxygen from a non-polymerized area will effectively increase the induction period of an immediately adjacent partially exposed area. This effect may be responsible for undercutting in some photopolymeric images.

Also as summarized by Walker et al., several approaches have been used to minimize the effect of oxygen on photopolymerization systems. While these methods are effective, they require added material cost (e.g., an oxygen impermeable cover sheet, added reducing agents or oxygen scavengers) longer processing time (e.g., conditioning in an inert atmosphere, or photo-conditioning by overall exposure to the threshold of the reaction), or a fairly restrictive choice of binder usable.

Accordingly, the objectives of this invention are to provide photopolymerizable compositions with the following characteristics: faster photographic speed; improved resistance to oxygen inhibition as evidenced by a reduced induction period, improved resolution, tonal range and image durability, and in some applications, even obviating the need for an air-impermeable cover sheet or the other approaches summarized by Walker et al. for minimizing the oxygen effect. These objectives, and others which will be apparent to those skilled in the art, are attainable using compositions defined hereinafter.

SUMMARY OF THE INVENTION

In a photosensitive composition comprising:

a. a hydrogen- or electron-donor compound, b. a hexaarylbiimidazole, c. an ethylenically unsaturated compound capable of forming a high polymer by free radical initiated, chain propagating, addition polymerization, the improvement wherein component (a) is a cyclic compound of the formula

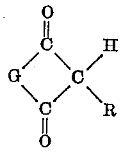

where R is a substituted or unsubstituted alkyl or aralkyl group, and G is a bivalent organic radical, which may contain hetero atoms in the radical chain, and which may optionally contain substituents on either carbon or hetero atoms, or both, said compositions having improved photographic speed and improved resistance to oxygen inhibition on photopolymerization.

In addition to the above constituents, the photosensitive composition can contain, if desired, an organic polymeric binder, a plasticizer for the binder, a thermal polymerization inhibitor, a sensitizer, and an adhesive aid, all as described more fully hereinafter, and the photosensitive element may include a support and a cover sheet or layer.

Depending on the use to which the photosensitive element is ultimately to be put and the nature of the final copy or copies desired, the photohardened image formed in the element can be subjected to a number of known development or readout methods. For example, if it is desired to make multiple final copies of the original, the unexposed, unhardened material can be removed from the element by solvent wash-out, and the element with the photohardened material remaining can be used as either a relief or planographic printing plate. Alternatively, copies of the original can be made by employing the unexposed portion of the image in known thermal transfer and/or toning procedures. Other applications may not require removal of the unexposed material, e.g., read-out of the photohardened image may be effected by Schlieren optics, or the image may be both recorded and read out by holographic techniques using lasers or other coherent light sources of different wavelengths. In any case, this invention offers advantages over the known art in providing photopolymerizable compositions having improved photographic speed and improved resistance to oxygen inhibition.

DESCRIPTION OF THE PREFERRED EMBODIMENTS

A preferred photosensitive element for use in this invention comprises a photopolymerizable stratum which contains an organic polymeric binder, a polymerizable monomer, a hexaarylbiimidazole, a sensitizer for the hexaarylbiimidazole, a hydrogen-donor compound of the formula

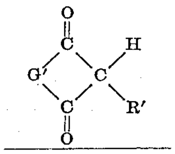

where R' is a lower alkyl group of one to four carbon atoms, a substituted lower alkyl group, or an aralkyl group, and G' is a bivalent organic radical which thereby completes a five- or six-membered ring, which may contain nitrogen in the radical chain, and which may optionally contain substituents on either carbon or nitrogen atoms, or both, and a plasticizer, each so selected and used in such proportions that the resulting stratum will preferably be solid below 40°C. It is to be understood, however, that one component may actually serve to fill two or more of the functions just named. Thus, for example, the polymerizable monomer and the polymeric binder may be so chosen that the former serves as a plasticizer for the latter.

Another preferred composition and element differ from the foregoing in that the organic polymeric binder and the polymerizable monomer are replaced by a polymeric compound having extralinear groups containing ethylenic unsaturation and capable of crosslinking with one or more adjacent polymeric chains.

The above preferred compositions appear particularly useful in toning film applications; thus, the preferred element would also include a support and a cover sheet. When the preferred compositions are to be used as photoresists, for which they are also particularly suitable, an adhesive aid would be included and no cover sheet need be employed.

For use according to the invention, by appropriate selection of the kind and proportion of binder, the preferred components outlined above may be mixed together in a suitable solvent and the resulting composition cast by conventional procedures to form, after evaporation of the solvent, a self-supporting photosensitive stratum. Alternatively, the solution of components may be coated on a base or substrate and the solvent then evaporated to leave a photosensitive stratum on the base. In still another embodiment, the binder may be omitted and the combination of the remaining components, with or without solvent, may be coated on a substrate and used in liquid, i.e., unhardened, form to carry out the process of the invention. As a matter of convenience in handling, it is generally preferred to use a binder and to employ a base or substrate, but it is to be understood that the scope of the invention is not limited to that embodiment or to the other embodiments mentioned above solely by way of illustration.

When a binder is used, it is preferred to employ an organic polymeric material that is solid at 50°C., and it is desirable that the binder be compatible with the polymerizable monomer, the polymerization initiator system, and any other components that may be present. It may frequently be desirable, but it is not required, that the binder be thermoplastic. The binder may be of the same general type as the polymerizable monomer being used and may be soluble therein and plasticized thereby.

The invention is based upon the surprising discovery that photopolymerizable systems, initiated by a hexaarylbiimidazole/hydrogen-donor compound combination, which are known to induce rapid and efficient photopolymerization, are improved in photographic speed and resistance to oxygen inhibition by the presence of the particular hydrogen-donor (sometimes called electron-donor) compounds described herein. Thus, by employing the cyclic, tertiary, hydrogendonor compounds of this invention, the above improvements are obtained over many known hydrogen donors for hexaarylbiimidazoles, as, for example, 5,5-dimethyl-1,3-cyclohexanedione, and 2-mercaptobenzothiazole.

The Components (A). Hydrogen- or Electron-Donor Compound

The hydrogen-donor component of the composition is a compound which has a reactive hydrogen atom which is removable to yield a radical that will react with the ethylenically unsaturated compound to initiate polymerization. Some of these materials are also sometimes referred to as electron-donor agents.

The hydrogen-donor component of this invention is a cyclic, β-dicarbonyl compound with an active methine group having a labile hydrogen atom; this component can be represented by the following formula:

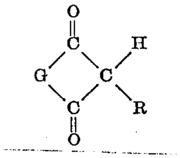

where R is an alkyl, substituted alkyl, or aralkyl group, and G is a bivalent organic radical, which may contain hetero atoms in the radical chain, and which may optionally contain substituents on either carbon or hetero atoms, or both.

In the foregoing, alkyl groups are of one to 12 carbon atoms. Substituted alkyl includes, for example, hydroxyalkyl, cyanoalkyl, haloalkyl, alkoxy-alkylene, alkylene thio-ethers, aryloxy-alkylene; thus, a wide variety of substituents are permissible, provided that they do not inhibit free radical induced, addition polymerization.

The aryl portion of the aralkyl group may contain six to 1 carbon atoms; further, the aryl and/or alkyl moieties may also bear substituents which do not inhibit free radical induced, addition polymerization, as illustrated, in part, above.

The bivalent organic radical, G above, completes a ring. This moiety may contain hetero atoms as, for example, nitrogen, oxygen, and sulfur. Further, the carbon or hetero atom or both may be optionally substitued with a wide variety of substituents, as illustrated in part above, providing only that the substituents do not inhibit free radical induced, addition polymerization. Some alternative permissible substituents which may be mentioned, include aryl, carbonyl, thiocarbonyl, arylene, ethylenic unsaturation, alkyl and aryl sulfonyl, alkyl and aryl sulfonamide, carboxamido, carboalkoxy, and carboaryloxy.

From the foregoing discussion, it will be appreciated that a large number of compounds is included in the class of hydrogen- or electron-donors of the invention, the requirements therefor being primarily that the compound be a cyclic β-dicarbonyl compound and have a tertiary hydrogen atom. Where substituted species are employed, it is of course necessary that the substituents be non-interfering, i.e., do not interfere with addition polymerization. As examples of several hydrogen- or electron-donors of the invention, the following compounds are illustrative.

2,4-diethyl-1,3-cyclobutanedione

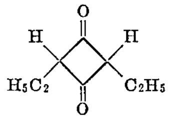

2-methyl-1,3-cycloheptanedione

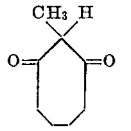

5-methyl-2-thiobarbituric acid

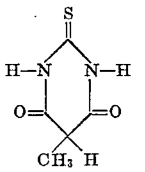

3-ethyltetronic acid

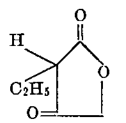

2,4-dimethyl-3-oxo-5-hydroxy-5-methoxy-pentenoic acid γ-lactone.

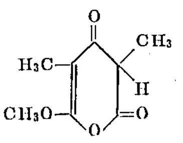

The preferred hydrogen-donor compounds, because of their availability and the improvement they afford with respect to superior photospeed and resistance to oxygen inhibition, have the structure

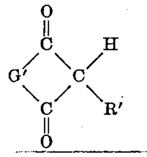

where R′ is a lower alkyl group of one to four carbon atoms, a substituted lower alkyl group, or an aralkyl group, and G′ is a bivalent organic radical which thereby completes a five- or six-membered ring, which may contain nitrogen in the radical chain, and which may optionally contain substituents on either carbon or nitrogen atoms, or both.

This preferred class is illustrated by the following compounds: 1,3,5-trimethylbarbituric acid; 1,3-dimethyl-5-ethylbarbituric acid; 2-methyl-1,3-cyclopentanedione; 5-methylbarbituric acid; 1,5-dimethylbarbituric acid; 2-methyldimedone; 2-methyl-1,3-indandione; 1,3-dimethyl-5-benzylbarbituric acid;

Bis-[5-(1,3-dimethylbarbituryl)]-methane.

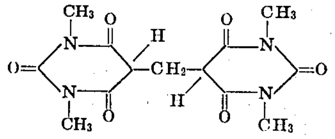

1,5-diphenyl-3-[2-(phenylthio)ethyl]-2,4-pyrrolidinedione.

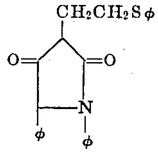

1-phenyl-3,5-diketo-4-n-butyltetrahydrophyrazole.

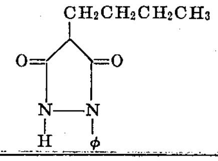

Further, as above, substituents are permissible which do not interfere with free radical induced, addition polymerization.

B. The Hexaarylbiimidazole

The hexaarylbiimidazoles are 2,2′, 4,4′, 5,5′-hexaarylbiimidazoles, sometimes called 2,4,5-triarylimidazolyl dimers, or lophine dimers, which are photodissociable to the corresponding triarylimidazolyl radicals. These hexaarylbiimidazoles absorb maximally in the 255–275 nm region, and usually show some, though lesser absorption in the 300–375 nm region. Although the absorption bands tend to tail out to include wavelengths as high as about 420 nm, they thus normally require light rich in the 255–375 nm wavelengths for their dissociation.

The hexaarylbiimidazoles can be represented by the formula

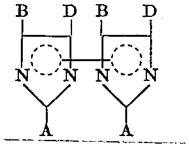

wherein A, B, and D represent aryl groups which can be the same or different, carbocyclic or heterocyclic, unsubstituted or substituted with substituents that do not interfere with the dissociation of the hexaarylbiimidazole to the triarylimidazolyl radical, and each dotted circle stands for four delocalized electrons (i.e., two conjugated double bonds) which satisfy the valances of the carbon and nitrogen atoms of the imidazolyl ring.

The aryl groups include one- and two-ring aryls, such as phenyl, biphenyl, naphthyl, furyl and thienyl. Suitable inert substituents on the aryl groups have Hammett sigma (para) values in the −0.5 to 0.8 range and are other than hydroxyl, sulfhydryl, amino. alkylamino or dialkylamino. Preferably they are free of Zerewitinoff hydrogen, i.e., have no hydrogens reactive towards methyl magnesium iodide. Representative substituents and their sigma values, (relative to H=0.00), as given by Jaffe, Chem. Rev. 53, 219–233(1953) are: methyl (−0.17), ethyl (−0.15), t-butyl (−0.20), phenyl (0.01), trifluoromethyl (0.55), chloromethyl (0.18), cyanomethyl (0.01), 2-carboxy-ethyl (−0.07), butoxy (−0.32), phenoxy (−0.03), fluoro (0.06), chloro (0.23), bromo (0.23), iodo (0.28), methylthio (−0.05), methylsulfonyl (0.73), nitro (0.78), ethoxycarbonyl (0.52), cyano (0.63), and carboxyl (0.27). Thus, the substituents may be halogen, cyano, lower hydrocarbyl (including alkyl, halo alkyl, hydroxyalkyl, cyanoalkyl, and aryl), alkoxyl, aryloxy, alkylthio, arylthio, sulfo, alkyl sulfonyl, aryl-sulfonyl, and nitro. In the foregoing list, alkyl groups referred to therein are preferably of one to six carbon atoms while aryl groups referred to therein are preferably of six to 10 carbon atoms.

Normally the B and D groups can carry 0–3 substituents and the A ring 0–4 substituents.

Preferably the aryl radicals are carbocyclic, particularly phenyl, and the substituents have Hammett sigma values in the range −0.4 to +0.4, particularly lower alkyl, lower alkoxy, Cl, F and Br groups.

In a preferred biimidazole class, the 2 and 2′ aryl groups are phenyl rings bearing an ortho substituent having a Hammett sigma value in the range −0.4 to +0.4. Preferred such ortho substituents are fluorine, chlorine, bromine, lower alkyl and alkoxy groups; especially chloro.

Most preferably, the 2-phenyl ring carries only the above-described ortho group, and the 4- and 5-phenyl rings are either unsubstituted or substituted with lower alkoxy.

Specific examples of the foregoing hexaarylbiimidazoles are disclosed in U.S. Pat. No. 3,445,234 and British Pat. No. 997,396. The portions of said patents pertinent to the biimidazole disclosure recited are incorporated herein by reference.

C. The Monomer

The instant invention is not limited to the use of any particular polymerizable monomer, it being required only that the monomer be ethylenically unsaturated and capable of addition polymerization. A large number of useful compounds is available, generally characterized by a plurality of terminal ethylenic groups. Among the suitable materials may be mentioned (a) various vinyl and vinylidene monomers, e.g., vinyl carboxylates, α-alkyl acrylates, α-substituted acrylic acids and esters thereof, vinyl esters, vinyl hydrocarbons, acrylic and α-substituted acrylic acid esters of the polymethylene glycols and ether alcohols, all as disclosed in Plambeck, U.S. Pat. Nos. 2,760,863 and 2,791,504; (b) the various compounds disclosed (col. 16, 11, 36 ff.) in Martin and Barney, U.S. Pat. No. 2,927,022, and especially those having a plurality of addition-polymerizable ethylenic linkages, particularly when present as terminal linkages, and more especially those wherein at least one and preferably most of such linkages are conjugated with a doubly bonded carbon, including carbon doubly bonded to carbon or to such hetero-atoms as nitrogen, oxygen and sulfur; (c) esters of pentaerythritol compounds of the kind disclosed in Celeste and Bauer, U.S. Pat. No. 3,261,686; and (d) compounds of the kind described in Cohen and Schoenthaler, U.S. Pat. No. 3,380,831, e.g., the reaction product of trimethoylolpropane, ethylene oxide, and acrylic and methacrylic acids.

The polymeric binder and the polymerizable monomer can be combined in a single material serving both of these functions, in which case the required ethylenic unsaturation can be present as an extralinear substituent attached to a thermoplastic linear polymer, e.g., polyvinyl acetate/acrylate, cellulose acetate/acrylate, cellulose acetate/methacrylate, N-acrylyloxymethyl polyamide, and the like. Suitable materials of this kind are described, for example, in U.S. Pat. Nos. 3,418,295 and 3,448,089. For convenience in expression herein, the term "polymerizable monomer" is to be understood as including ethylenically unsaturated, photocrosslinkable polymeric compounds of this kind, and the term "polymerization" to include crosslinking.

Many of the low molecular weight polymerizable components discussed previously, including both the mono- and polyethylenically unsaturated compounds, will normally contain, as obtained commercially, minor amounts (about 50–100 parts per million by weight) of polymerization inhibitors to prevent spontaneous thermally induced polymerization before desired. The presence of these inhibitors, which are usually of the antioxidant type, in such amounts causes no undesirable results in the practice of this invention, either as to speed or as to quality of polymerization. Among the suitable thermal polymerization inhibitors are p-methoxyphenol, hydroquinone, alkyl- and aryl-substituted quinones and hydroquinones, tert-butyl catechol, pyrogallol, copper resinate, naphthylamines, β-naphthol, cuprous chloride, 2,6-di-tert-butyl-p-cresol, phenothiazine, pyridine, nitrobenzene and dinitrobenzene, p-toluquinone, chloranil, and thiazine dyes, e.g., Thionine Blue G (C.I. 52–25), Methylene Blue B (C.I. 52015), and Toluidene Blue O (C.I. 52040).

The Binder

The binder used as an organic polymeric material that is preferably solid at 50°C., and it is desirable that the binder be compatible with the polymerizable monomer and the polymerization initiator system. It may frequently be desirable, it is not required, that the binder be thermoplastic. The binder may be of the same general type as the polymerizable monomer being used and may be soluble therein and plasticized thereby.

A wide variety of suitable binders, both thermoplastic and nonthermoplastic, is disclosed in Burg and Cohen, U.S. Pat. No. 3,060,023, e.g., cellulose ethers or esters; polyalkylene ethers; condensation polymers of glycols with dibasic acids; polymers and copolymers of vinyl esters; acrylic acids and esters; polyvinyl alcohol; cellulose; gelatin; phenolic resins; and the like. Other binders, including a number of vinylidene polymers, are disclosed in Plambeck, U.S. Pat. Nos. 2,760,863 and 2,791,504. Still other useful binders are (a) the N-methoxymethyl polyhexamethylene adipamide mixtures of Saner, British Pat. No. 826,272 (b) the polyester, polyacetal or mixed polyesteracetal mixtures of Martin, U.S. Pat. No. 2,892,716; (c) the fusible polyvinyl alcohol derivatives of Martin, U.S. Pat. No. 2,902,365; (d) the fusible blends of selected organic-soluble, base-soluble cellulose derivatives of Martin and Barney, U.S. Pat. No. 2,927,022; (e) the polyvinyl acetal compositions having extralinear vinylidene groups of Martin, U.S. Pat. No. 2,902,710; (f) the linear polyamide compositions containing extralinear N-acrylyloxymethyl groups of Saner and Burg, U.S. Pat. No. 2,972,540; and (g) the 1,3-butadiene compositions of McGraw, U.S. Pat. No. 3,024,180.

For use according to the invention, by appropriate selection of the kind and proportion of binder, the preferred components outlined above may be mixed together in a suitable solvent and the resulting composition cast by conventional procedures to form, after evaporation of the solvent, a self-supporting photosensitive stratum. Alternatively, the solution of components may be coated on a base or substrate and the solvent then evaporated to leave a photosensitive stratum on the base. As a matter of convenience in handling, it is generally preferred to employ a base or substrate.

Sensitizers

The spectral sensitivity of the hexaarylbiimidazoles may be extended to visible light by also incorporating into the above-described compositions a visible-light-absorbing energy-transferring agent such as Erythrosin B, Rose Bengal or other phthalein dyes disclosed in Walker, U.S. Pat. No. 3,563,750; Acridine Orange, Diethyl Orange or other aminoacridine dyes disclosed in Cohen, U.S. Pat. No. 3,563,751; 3,3′-diethyl-4,5,4′,5′-dibenzoxacarbocyanine p-toluene sulfonate, 3,3′-diethyloxaselenacarbocyanine iodide, 3,3′-di-n-butyl-9-methylthiacarbocyanine iodide, 3,3′-diethyl thiaselenacarbocyanine iodide, 3,3′-diethyl selenacarbocyanine iodide or the like carbocyamine dyes disclosed in Cohen, U.S. Pat. No. 3,554,753; 7-diethylamino-4-methylcoumarin, 7-dimethylamino-4-methylcoumarin, or the like coumarins disclosed in James and Witterholt, U.S. Pat. No. 3,533,797; Michler's ketone and the p-aminophenyl ketones disclosed in Fishman, U.S. Pat. No. 3,552,973; selected furans, oxazoles, and oxadiazoles disclosed in Grubb, U.S. Ser. No. 827,072 filed May 22, 1969, allowed Aug. 24, 1971; selected aromatic hydrocarbons, e.g., perylene, pyrene; the bis(p-aminophenyl)-$\alpha$, $\beta$-unsaturated ketones as described by Baum and Henry, U.S. Ser. No. 53,686, filed July 9, 1970, allowed Sept. 7, 1971, said patents and applications being assigned to the assignee herein.

Plasticizers

A wide range of non-polymerizable plasticizers are effective in achieving improved exposure and development temperature latitude. When a macromolecular binder is present in the layer, plasticizer selection would be based on those well known in the art to be compatible with it as well as the monomer, hexaarylbiimidazole, hydrogen-donor compound, and other components. With acrylic binders, for example, dibutyl phthalate and other esters of aromatic acids; esters of aliphatic polyacids such as diisooctyl adipate, nitrate esters, etc.; aromatic or aliphatic acid esters of glycols, polyoxyalkylene glycols, aliphatic polyols, etc.; alkyl and aryl phosphates; low molecular weight polyesters of poly-$\alpha$-methylstyrenes; chlorinated paraffins; and sulfonamide types may be used. In general, water insoluble plasticizers are preferred for greater high humidity storage stability.

Adhesive Aids

When the inventive photosensitive compositions are applied to metals for use in photoresist applications, an adhesive aid is frequently added to the composition. Useful adhesive aids, which may be incorporated, include the monomeric or polymeric organic silanes, and the nitrogen containing heterocyclic compounds, e.g., benzotriazole, disclosed in Jones, U.S. Pat. No. 3,645,722, issued Feb. 29, 1972, and Hurley et al., U.S. Pat. No. 3,622,234, issued Nov. 23, 1971.

Component Proportions

In formulating the inventive photosensitive compositions, the above named constituents may be present in the following amounts, reported as percentage by weight of the total solids; hydrogen-donor compound, 0.5 – 7.5 percent; hexaarylbiimidazole, 0.5 – 15 percent; monomer, 2 – 93 percent; binder, 0 – 70 percent; sensitizer, 0 – 5 percent; plasticizer, 0 – 15 percent; adhesive aid, 0 – 5 percent.

Other Optional Components

Various dyes, pigments, thermographic compounds and color forming components can be added to the photopolymerizable compositions to give varied results after development. These additive materials, however, preferably should not absorb excessive amounts of radiation at the exposure wavelength or inhibit the polymerization reaction.

Representative dyes, pigments, etc., useful in this invention are disclosed in Chambers, U.S. Pat. No. 3,479,185, columns 17–18.

Preparation of Elements

As previously indicated, the several components of the photosensitive compositions will orginarily be mixed together in a material that is a solvent for all of the components. The particular solvent used is not critical; it merely affords a practical method of obtaining coatings or self-supporting films of the compositions. Representative of solvents that may be used, but in no way limiting are 2-propanone, 2-butanone, 2-pentanone, 1,2-dichloroethane, methyl acetate, dichloromethane, trichloromethane, and ethyl acetate.

For convenience in handling, the photopolymerizable composition is preferably coated on a base support. Suitable materials include films composed of high polymers such as polyamides, e.g., polyhexamethylene sebacamide, polyhexamethylene adipamide; polyolefins, e.g., polyethylene, polypropylene; polyesters, e.g., polyethylene terephthalate, polyethylene terephthalate/isophthalate; vinyl polymers, e.g., vinyl acetals, vinylidene chloride/vinyl chloride copolymers, polystyrene, polyacrylonitrile; and cellulosics, e.g., cellulose acetate, cellulose acetate/butyrate, cellophane. A particularly preferred support material is polyethylene terephthalate film of the kind described in Alles et al., U.S. Pat. No. 2,627,088, and Alles, U.S. Pat. No. 2,779,684, with or without the surface coating described in the former patent. Where the particular application does not require that the base support be transparent, the photopolymerizable composition may usefully be coated on an opaque support, such as paper, especially water-proof photographic paper; thin metal sheets, especially aluminum and copper sheets (e.g., the strippable supports for photoresists as described by Celeste in U.S. Pat. No. 3,469,982); cardboard; and the like. The support used, of whatever type, may also have in or on its surface and beneath the photopolymerizable stratum an antihalation layer or other substrate needed to facilitate anchorage of the photopolymerizable stratum to the base. The manner of coating the photosensitive composition on a base or of casting it to form a self-supporting film is not critical; these operations are readily performed by procedures well known to those skilled in the art.

Even after evaporation of the solvent, many of the photosensitive coatings or self-supporting films made from the various components outlined above are somewhat soft, sticky, or tacky. To facilitate storage and handling, it may frequently be desirable to apply a cover layer, which may be either an additional coating or a previously cast film. A convenient and suitable material is any of the several commercially available varieties of polyethylene film. Alternatively, any of a number of readily soluble polymeric materials, e.g., cellulose acetate, may be coated in solution over the photosensitive stratum to leave, after removal of solvent, a hard, dry, non-tacky surface. Depending on the degree of tackiness of the photosensitive stratum, the protective layer may be left in place during exposure or not, as desired. If it is to be left in place, the material selected should have good clarity.

The Process

This invention involves a process for making images in a photopolymerizable layer which comprises exposing to actinic light selected portions of the photopolymerizable layer until substantial addition polymerization occurs in the exposed areas of said layer with substantially no polymerization in the unexposed portions of the layer followed by a development operation. The development may be accomplished by solvent washout, thermal transfer, pressure transfer, application of pigments to unpolymerized areas, differential adhesion of the exposed vs. unexposed areas, etc. The development will produce either a relief surface or an image on a separate receptor. The photopolymerizable layer can also be modified by diffusion etching, plating, (e.g., electroplating), dyeing, alteration of the sensitivity of radiation-sensitive layers, etc. Schlieren optics or other physical means can also be used to distinguish between polymerized and unpolymerized image areas.

As may be seen by the examples, polymerization with the initiating systems of the present invention may be effected not only by exposure to ultraviolet or blue light, but also by exposure to light sources giving predominantly or only visible radiations. Thus, ordinary daylight would be adequate for photopolymerization of many of the compositions here described. Other useful light sources are those of moderate intensity which yield a high percentage of radiation in the visible spectrum, e.g., tungsten filament sources such as projection lamps or the source can be those which are rich in the ultraviolet such as carbon arcs, mercury vapor arcs, fluorescent lamps, argon glow lamps, electronic flash units, and photographic flood lamps. Lasers may also be used.

Utility

The photopolymerizable compositions and elements of this invention may be coated on metal surfaces to make presensitized lithographic printing plates, or to serve as photoresists in making etched or plated circuits, gravure resists, or in chemical milling applications. They are also useful for preparing colored images from color separation negatives suitable for color proofing. The images formed with these elements may also be used for making copies by thermal transfer to a substrate. Specific uses will be evident to those skilled in the art; many preferred uses are disclosed in the patents and applications previously cited regarding hexaarylbiimidazoles as one component of a photopolymerization initiator.

The basic advantage of the invention is that it provides a photopolymerizable system having improved photographic speed and improved resistance to oxygen inhibition.

The invention will be further illustrated by, but is not intended to be limited to, the following examples, wherein parts and percentages are by weight unless otherwise noted.

EXAMPLE I

The following ingredients were mixed by conventional laboratory procedures:

| | |
|---|---|
| Cellulose acetate (Acetyl 40.0%, ASTM Visc. 25) | 2.7 g |
| Cellulose acetate butyrate (Butyrate 17%, ASTM Visc. 15) | 4.2 g |
| Trimethylol propane triacrylate | 13.5 g |
| Acetone | 116.0 g |
| 2,2'-Bis(o-chlorophenyl-4,4',5,5'-tetrakis(m-methoxyphenyl)biimidazole | 0.761 g |
| 3,3'-Diethylthiacyanine p-toluenesulfonate | 0.244 g |

Equimolar quantities of hydrogen-donor compounds were added to 10 ml-portions of the above stock solution, as shown in Table I. The solutions were coated on 0.001-inch-thick polyethylene terephthalate supports to a wet thickness of 0.002 inches, dried to form a photopolymerizable layer and laminated at room temperature with 0.001-inch-thick polyethylene terephthalate cover sheets.

Samples were exposed through a silver step tablet having a density gradation of $\sqrt{2}$ optical density units per step. Exposures were made for 30 seconds with a 1,000-watt tungsten-filament bulb (General Electric DXW) operated at 120 volts to give a color temperature of 3,200°K, at a distance of 60 inches from the sample. After exposure, the cover sheet was removed, and the photopolymerizable layer was dusted with Quindo Magenta, C.I. Pigment Red 122 to give a positive image. The results obtained are summarized in Table I.

Table I

| Example No. | Hydrogen-Donor Compound | Amount (mg) | Steps Polymerized |
|---|---|---|---|
| I | 2,5,5-trimethyl-1,3-cyclohexanedione (2-methyldimedone) | 7.4 | 1 – 13 |
| Control A | None | — | 0 |
| Control B | 5,5-dimethyl-1,3-cyclohexanedione (dimedone) | 6.8 | 1 – 5 |
| Control C | 2-mercaptobenzothiazole | 8 | 1 – 8 |
| Control D | N-phenylglycine | 7.1 | 1 – 10 |

The above results indicate that a hydrogen-donor compound is necessary to obtain photopolymerization.

More importantly, they illustrate the improved photographic speed obtainable with a hydrogen-donor of this invention over the closest structural homologue of the art (Control B). Values for two other hydrogen-donors (Controls C and D), previously known for their high efficiency, are also shown.

EXAMPLE II

This example demonstrates the usefulness of these hydrogen donors in transfer toning film applications. The following composition was prepared:

| | Grams |
|---|---|
| Trimethylol propane trimethacrylate | 207.4 |
| Poly(methylmethacrylate) (Inherent Viscosity-0.20–0.22 for 0.25 gram in 50 milliliters chloroform at 25°C in a No. 50 Cannon-Fenske viscometer) | 74.8 |
| 7-Diethylamino-4-methylcoumarin | 6.80 |
| Tricresyl phosphate | 8.50 |
| 2,2'-Bis(o-chlorophenyl)-4,4',5,5'-tetrakis(m-methoxyphenyl)biimidazole | 34.00 |
| 2-Methyl-1,3-indandione | 8.50 |

These ingredients were dissolved in sufficient trichloroethylene to make 2 liters of solution. This solution was coated from an extrusion die coater on the resin side of a 0.004-inch-thick polyethylene terephthalate photographic film base subbed with the resin sub of Alles, U.S. Pat. No. 2,779,684, Example IV support and allowed to dry. The coated base (coating density 26 mg/dm$^2$ after drying at 165°F) was laminated with polypropylene film.

The film was exposed through the polypropylene sheet through a $\sqrt{2}$ step wedge (Graphic Arts Technical Foundation Research Bulletin No.215) for 5 minutes in a NuArc "Flip-Top" Platemaker, Model FT 26L, using a filter screen (percent at given wavelength: 0.3 percent, 350 mμ; 1.7 percent, 400 mμ; 1.7 percent, 450 mμ; 35 percent, 500 mμ) interposed between the NuArc source and the film. After removing the polypropylene cover sheet, Jungle Black (Pigment Black I, C.I. 50440), was dusted on the surface. After removing excess toner, only the tacky unpolymerized areas still retained toner. This image could be thermally transferred to a paper support to give an image which retained toner from step Nos. 10–21. The transferred image could be post-hardened by overall exposure in the vacuum frame of the NuArc or by transferring the image to the paper support at 130°–135°C.

EXAMPLE III

The utility of these hydrogen-donor compounds in laminating type toning films is shown in this example. The following composition was prepared:

| | Grams |
|---|---|
| 2,2'-Bis(o-chlorophenyl)-4,4',5,5'-tetrakis(m-methoxyphenyl)biimidazole | 1.75 |
| 1,3,5-Trimethylbarbituric acid | 8.75 |
| Poly(methylmethacrylate) (Inherent Viscosity-1.25–1.50 for a solution of 0.25 grams in 50 milliliters of chloroform, at 25°C, using a No. 50 Cannon-Fenske Viscometer) | 103.50 |
| Tricresyl phosphate | 26.25 |
| Trimethylol propane trimethacrylate | 201.25 |
| 7-Diethylamino-4-methylcoumarin | 3.50 |

These materials were dissolved in enough trichloroethylene to make 1 liter of solution which was extrusion coated on poly (ethylene glycol terephthalate) film. After drying at 108°F, the coated layer (0.3 mil thick) was laminated with polypropylene film.

In use, the polypropylene sheet from a section of film was removed, and the film was laminated to a paper support. This sandwich was exposed through a halftone dot pattern to the NuArc source (minus filter screen) described in Example II for 3 seconds. The film base was then stripped from the support, and the support, containing the photopolymer material, was toned as in Example I. This yielded a good quality image. The image resolved 3 percent highlight dots and 90 percent shadow dots at 150 line pairs/inch.

EXAMPLE IV

This example shows the application of these hydrogen donors in a high resolution resist for microcircuit use. The following composition was prepared:

| | Grams |
|---|---|
| Poly(methylmethacrylate) (2–3 × 10$^6$ molecular weight) | 179.55 |
| Triethylene glycol diacrylate | 53.55 |
| Poly(methylmethacrylate-methacrylonitrile-siloxane) in a ratio of 88/11/9 parts by weight | 25.83 |
| Tricresyl phosphate | 4.725 |
| 2,2'-Bis(o-chlorophenyl)-4,4',5,5'-tetrakis(m-methoxyphenyl)biimidazole | 36.225 |
| 1,3-Bis(p-dimethylaminobenzylidene)acetone | 9.450 |
| 1,3,5-Trimethylbarbituric acid | 7.875 |
| Trichloroethylene | 4933.00 |

This solution was applied dropwise to a silicon-silicon dioxide wafer (si–Cz–P–111(1–3) 12500 A chip from Semiconductor Specialties Corporation baked at 300°C for at least 3 hours) spinning at 300–500 revolutions per minute until a smooth coating about 0.1 mil thick was obtained. After drying 5 minutes at room temperature, the chip was exposed to U.S. Air Force 1951 Resolving Power Test Target for 6 minutes on the NuArc source (minus filter) described in Example II. In this case, the vacuum was not applied, i.e., this material is air exposable. After exposure, a light stream of 50 percent ethanol—50 percent 1,1,1-trichloroethane was rinsed over the chip for 1 minute, and the chip was air dried 2–5 minutes and heated at 150°C for 5 minutes under nitrogen. The chip was then etched 7 minutes in 6 parts of 40 percent ammonium fluoride and 1 part of 48 percent hydrofluoric acid at room temperature. The etched chip was rinsed with water and cleaned with methylene chloride. This produced a final etched wafer showing a resolution greater than 229 line pairs per millimeter.

EXAMPLE V

These hydrogen donors can also be used to make air-exposable copper resists. For this application, the following formulation was prepared:

| | Grams |
|---|---|
| 1,3,5-Trimethylbarbituric acid | 10.50 |
| 1,3-Bis(p-Dimethylaminobenzylidene)acetone | 12.60 |
| 2,2'-Bis(o-chlorophenyl)-4,4',5,5'-tetrakis(m-methoxyphenyl)biimidazole | 47.46 |
| Benzotriazole | 16.80 |
| Poly(methylmethacrylate)(see Example IV) | 270.80 |
| Tricresyl phosphate | 7.14 |
| Trimethylol propane triacrylate | 50.40 |
| 7-[(4-Chloro-6-diethylamino-s-triazin-2-yl)amino]3-phenyl-coumarin | 4.20 |
| Methylene chloride | 2298.00 |
| Trichloroethylene | 2523.00 |

This solution was coated with a 6 mil doctor knife on a clean, copper clad, epoxy-fiberglass board and dried 5–10 minutes at room temperature. This was exposed through a typical printed circuit target, for approximately 1.5 minutes, to a high-pressure mercury arc (a Scanex II model, Colight Inc., Minneapolis, Minn., which contains two opposing 4,800-watt Hanovia lamps); the lamp to target distance is approximately 4 inches. After exposure, the unpolymerized areas, corresponding to the opaque areas of the circuit target, were removed by soaking in 1,1,1-trichloroethane for 40 seconds, then wiped dry, leaving a photopolymeric image.

This example demonstrates the ready application of this invention to a system for the production of printed circuits. After solvent wash-out as described, the board was etched by soaking 15 minutes at room temperature in a saturated solution of $FeCl_3$ in HCl to remove copper from areas not protected by the photo-hardened image, then water rinsed. The photopolymer image was then removed by scrubbing with methylene chloride to reveal the remaining copper in the form of a circuit reproducing the pattern of the original process transparency.

EXAMPLE V-*b*

All the hydrogen-donor compounds mentioned in this application are known and with the exception of bis-[5-(1,3-dimethylbarbituryl)]-methane; this new compound was prepared as follows:

1,3-Dimethylbarbituric acid (1.558 g), potassium hydroxide (0.29 g), and diethylamine (0.05 ml) were dissolved in water (55 ml). After heating this solution to 80°C, formaldehyde (0.4 ml of a 37 percent aqueous solution) was added; the reaction mixture was held at 80°C for 3.5 hours, with stirring. Following cooling to room temperature, the orange solution was made strongly acid by the addition of concentrated hydrochloric acid, which yielded a white precipitate of product (1.07 g), bis-[5-(1,3-dimethylbarbituryl)]-methane; m.p. = 216° – 219°C with decomposition. The infrared and NMR spectra were consistent with the structure assigned.

When the above compound is substituted for the hydrogen-donor compound of Example V, comparable results may be obtained.

EXAMPLE VI

These hydrogen donors can be used effectively in aqueous developable, air-exposable resists. For this purpose, the following formulation was prepared:

| | Grams |
|---|---|
| Poly(methylmethacrylate/methacrylic acid) (90/10) | 322.875 |
| Trimethylol propane trimethacrylate | 78.750 |
| 1,3-Bis(p-Dimethylaminobenzylidene)acetone | 15.750 |
| 7-[(4-Chloro-6-diethylamine-s-triazin-2-yl)amino]- 3-phenyl-coumarin | 5.25 |
| Tricresyl phosphate | 10.50 |
| 2,2'-Bis(o-chlorophenyl)-4,4',5,5'-tetrakis(m-methoxyphenyl)biimidazole | 57.75 |
| 1,3,5-Trimethylbarbituric acid | 13.125 |
| Benzotriazole | 21.00 |
| Trichloroethylene | 4725.00 |

This solution was dip coated on a clean copper plate and dried 5–10 minutes in air at room temperature. The coated plate was exposed through a halftone dot pattern for 2 minutes on the NuArc source (minus filter) described in Example II, with no applied vacuum. The exposed plate was developed by washing out the unpolymerized portions of the coatings using a solution of the following composition:

| Component: | Amount |
|---|---|
| Distilled water | 750 ml. |
| Silicate of Soda (3.85 $SiO_2$:1 $Na_2O$) | 78 g. |
| 2-*n*-butoxyethanol | 60 ml. |
| 10 percent by weight aqueous solution of octylphenoxyethanol of the formula: | 2 ml. |

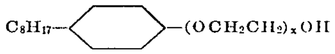

where $x$ is 9–10.
Distilled water to make 1 liter.

(The pH was 11.0.)

For development, the above solution was poured onto the exposed plate, allowed to react for 30 seconds, and the image produced by gently sponging the entire surface of the plate with developer. The plate was then rinsed with fresh water to yield a good quality resist in the range 5–90 percent dots with a 100 lines per inch screen.

EXAMPLE VII

Compositions containing these hydrogen donors are useful in preparing lithographic printing plates also. For this use, the formulation prepared in the preceding example was spray coated on grained aluminum to about 0.6 mil thick. This was exposed for 1 minute through a step wedge on the NuArc source (minus filter) as described in Example II. The plate was developed by 60-second contact with the developer also described in the preceding example. Washout was completed by simultaneously rinsing with water and hand-washing. Under these conditions, steps 1–4 were not washed off. Plates prepared in this way could be used for printing.

EXAMPLES VIII – XI

These examples illustrate other useful hydrogen-donor compounds of the invention.

A stock solution was prepared containing the following ingredients:

| | Grams |
|---|---|
| 2,2'-Bis(o-chlorophenyl)-4,4',5,5'-tetrakis(m-methoxyphenyl)biimidazole | 0.38 g |
| Cellulose acetate (acetyl 40.0%, ASTM Visc. 25) | 1.6 |
| Cellulose acetate butyrate (Butyrate 17%, ASTM Visc, 15) | 2.5 |
| Trimethylol propane triacrylate | 8.0 |
| Acetone | 68.8 |

Quantities of hydrogen-donor compounds were added to the stock solution as given in Table II.

The solutions were coated on 0.001-inch-thick polyethylene terephthalate supports to a wet thickness of 0.002 inches, dried to form a photopolymerizable layer and laminated at room temperature with 0.001-inch-thick polyethylene terephthalate cover sheets.

Samples were exposed through an Eastman Kodak M-type step tablet No. 5 composed of carbon particles Table II

| | | Hydrogen-donor Compound | | |
|---|---|---|---|---|
| Example No. | Stock Solution(g) | Name | Amount (mg) | Equivalent Exposure Time(Sec) |
| VIII | 8.1 | 1,5-Diphenyl-3-[2(phenylthio)ethyl]-2,4-pyrrolidinedione | 37.2 | 0.75 |
| IX | 8.1 | 1-Phenyl-3,5-diketo-4-n-butyl-tetrahydropyrazole | 22.3 | 36 |

Table II – Continued

| Hydrogen-donor Compound | | | | |
|---|---|---|---|---|
| Example No. | Stock Solution(g) | Name | Amount (mg) | Equivalent Exposure Time(Sec) |
| X | 8.1 | 1,3,5-Trimethylbarbituric acid | 16.5 | 1.5 |
| XI | 16.2 | Compound of Example X and, as a sensitizer, 3,3'-diethylthylthia-cyanine p-toluenesulfonate | 74.4<br>26.0 | 0.4 |

dispersed in gelatin and sealed in cellulose acetate, having a density gradation of $\sqrt[3]{2}$ optical density units per step. Exposures were made with a 1,000 watt tungsten-filament bulb (General Electric DXW) operated at 120 volts to give a color temperature of 3,200°K, at a distance of 44 inches from the sample.

After exposure, the cover sheet was removed, and the photopolymerizable layer was dusted with Jungle Black (Pigment Black I, C.I. 50440) to give a positive image. The optical densities of the steps of the image were measured and plotted against log exposure. The log exposure which gave an optical density of 0.1 above the optical density of base plus fog was chosen as characteristic of the sensitivity of the layer. The relative speeds of several compositions are given in Table II, expressed as equivalent exposure time, the actual exposure time required to form an image of optical density 0.1 above base plus fog multiplied by the per cent transmission of the step wedge at that point. Note that a lower number means a photographically faster system.

EXAMPLES XII - XIX

These examples further demonstrate the range of effective structural types of hydrogen donors that are useful. The apparatus consisted of a calorimeter arranged in such a way that monochromatic light (366 mμ) of about $10^{14}$ photons per second could be beamed onto samples which were on a 2 × 2 centimeter silver plate and covered with a piece of poly(ethylene glycol terephthalate). The samples were one drop of a solution of the indicated amount of test material in 1 milliliter of a stock solution to give a concentration approximately 0.2 molar. The stock solution contained 2.304 grams of 2-(o-chlorophenyl)-4,5-di(m-methoxyphenyl) imidazolyl dimer, 2.172 grams of 7-diethylamino-4-methylcoumarin, and 0.005 gram of 2,6-di-tert-butyl-4-methylphenol in 99.1 grams of triethylene glycol dimethacrylate. A small amount of precipitate was filtered from the stock solution before use.

The induction period and relative polymerization rate of the compounds were determined from the photocalorimeter trace, which is a plot of temperature v. time. Since the polymerization is an exothermic reaction, temperature rise indicates polymerization. The time from the beginning of irradiation to the earliest noticeable change in temperature is referred to as the "induction period." The induction period for these experiments was arbitrarily defined as the length of time required to get a temperature change of 0.003°C. The relative rate of polymerization was taken to be proportional to the slope of the temperature v. time curve before cooling effects were pronounced. The results are given in Table III.

TABLE III.—COMPOUNDS TESTED

| | Compound | Structure | Induction* period (sec.) | Relative** polymerization rate |
|---|---|---|---|---|
| (XII) | 1,3,5-trimethylbarbituric acid | 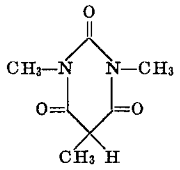 | 4 | 1.00 |
| (XIII) | 1,3-dimethyl-5-ethylbarbituric acid | 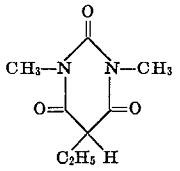 | 6 | 0.70 |
| (XIV) | 2-methyl-1,3-cyclopentanedione[a] | 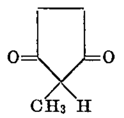 | 11 | 0.65 |
| (XV) | 5-methylbarbituric acid[a] | 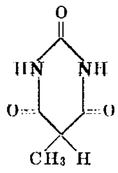 | 8 | 0.56 |

TABLE III.—COMPOUNDS TESTED—Continued

| | Compound | Structure | Induction* period (sec.) | Relative** polymerization rate |
|---|---|---|---|---|
| (XVI) | 1,5-dimethylbarbituric acid[a] | 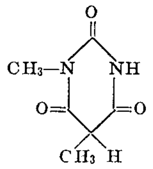 | 6 | 0.93 |
| (XVII) | 2-methyldimedone[a] | 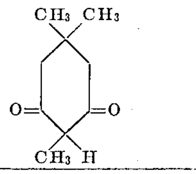 | 6 | 0.60 |
| (XVIII) | 2-methyl-1,3-indandione[b] | 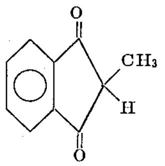 | 3 | 0.77 |
| (XIX) | 1,3-dimethyl-5-benzybarbituric acid | 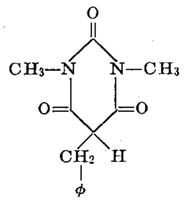 | 6 | 1.14 |
| (Control H) | N-phenylglycine[a c] | $\phi \overset{\oplus}{N}H_2CH_2CO_2^{\ominus}$ | 3 | 0.86 |
| (J) | Dimedone | 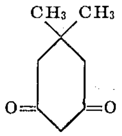 | 12 | 0.44 |
| (K) | 9-fluorenecarboxylic acid[a] | 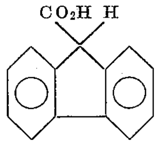 | 21 | 0.14 |
| (L) | 3-hydroxyphthalide | 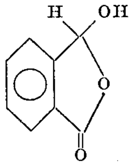 | 22 | 0.085 |
| (M) | 5-nitrobarbituric acid[a] | 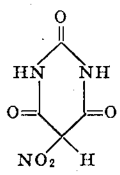 | 44 | 0.074 |
| (N) | 1,4-bis-[3-(5-tetrafluoroethyl-1,2,4-oxadiazolyl)] benzene. | 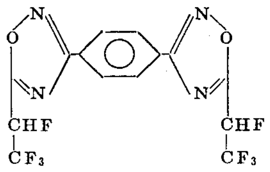 | 53 | 0.099 |

TABLE III.—COMPOUNDS TESTED—Continued

| | Compound | Structure | Induction* period (sec.) | Relative** polymerization rate |
|---|---|---|---|---|
| (O) | 2-phenyl-1,3-indandione[d] | 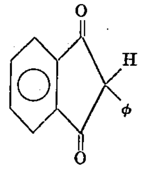 | 55 | 0.085 |
| (P) | 2,4,6-trimethyl-s-trioxane | 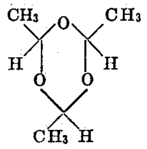 | No evidence of polymerization | |
| (Q) | 1-Phenylphthalen | 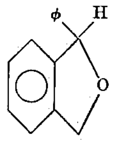 | No evidence of polymerization | |
| (R) | 2,5-dimethoxy-2,5-dihydrofuran | 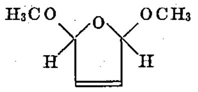 | No evidence of polymerization | |
| (S) | Uramil[a] | 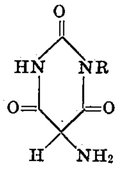 | No evidence of polymerization | |
| (T) | Dehydroacetic acid | 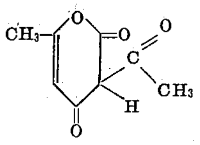 | No evidence of polymerization | |
| (U) | Proline[a] | 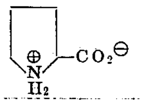 | No evidence of polymerization | |
| (W) | 2,4-dimethylsulfolane | 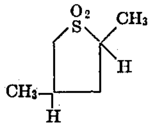 | No evidence of polymerization | |
| (Y) | 4,5-dimethyl-2-oxo-1,3,2-dioxathiolane | 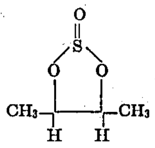 | No evidence of polymerization | |
| (Z) | Triptycene | 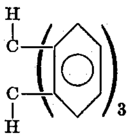 | No evidence of polymerization | |
| (a') | Triphenylmethane | $\phi_3CH$ | No evidence of polymerization | |
| (b') | Diethyl methmalonate | $CH_3$<br>$HC(CO_2C_2H_5)_2$ | No evidence of polymerization | |
| (c') | Diethyl etkylmalonate | $C_2H_5$<br>$HC(CO_2C_2H_5)_2$ | No evidence of polymerization | |
| (d') | 1,1-diphenylacetone | C<br>‖<br>$\phi_2CHCCH_3$ | No evidence of polymerization | |
| (e') | Dimethyl trifluoromethyl malonate | $CF_3$<br>$HC(CO_2CH_3)_2$ | No evidence of polymerization | |

[a] Not completely soluble at 0.2 *M*; run as a saturated solution.
[b] Run under slightly different conditions.
[c] Included for comparison.
[d] Also polymerized in about the same time in the dark.

*Time required to give the earliest noticeable temperature change.
**Relative rates of temperature change after the induction period was over.

Examples XII–XIX demonstrate the improvement either in decreased induction period, or increased photopolymerization rate, or both, of compounds of the invention over a close structural homologue, dimedone (Control J). Further, the examples and controls amply illustrate that only selected substituents are permissible on the methine carbon flanked by the two carbonyl groups. To be more specific, Controls M, O, S and T shows that the methine carbon cannot be substituted with phenyl, nitro, amino, or acetyl groups and still yield the improvements of the invention.

Several other control experiments demonstrate the surprising advantage of the cyclic compound of the invention over acyclic analogues (controls *b′* – *e′*), as well as over analogous cyclic compounds containing hydrogen at a tert-carbon, but devoid of the beta-dicarbonyl moiety (Controls L, P, Q, R, W and Y).

We claim:

1. In a photosensitive composition comprising:

a. a hydrogen- or electron-donor compound, b. a hexaarylbiimidazole, c. an ethylenically unsaturated compound capable of forming a high polymer by free radical initiated, chain propagating, addition polymerization, the improvement wherein component (a) is a cyclic compound of the formula

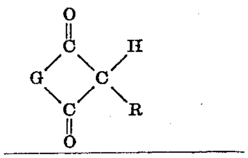

where R is an alkyl or aralkyl group, and G is a bivalent organic radical completing a five or six membered ring, R and G being independently unsubstituted or substituted with substituents that do not interfere with free radical induced, addition polymerization.

2. The photosensitive composition of claim 1, wherein G contains hetero atoms.

3. The photosensitive composition of claim 1, wherein R is a lower alkyl group of one to four carbon atoms, or an aralkyl group whose aryl portion contains 6–10 carbon atoms.

4. The photosensitive composition of claim 3 containing 0.5 – 7.5 percent of said hydrogen- or electron-donor compound, 0.5 – 15 percent of said hexaarylbiimidazole, and 2 – 93 percent of said ethylenically unsaturated compound, said percentages being by weight as percent of total solids.

5. The photosensitive composition of claim 3 containing up to 70 percent by weight of a binder.

6. The photosensitive composition of claim 5 wherein the binder comprises poly(methylmethacrylate) having a molecular weight of 2–3 $\times 10^6$.

7. The photosensitive composition of claim 3 wherein said hydrogen- or electron-donor compound is selected from 1,3,5-trimethylbarbituric acid; 1,3-dimethyl-5-ethylbarbituric acid; 2-methyl-1,3-cyclopentanedione; 5-methylbarbituric acid; 1,5-dimethylbarbituric acid; 2-methyldimedone; 1,3-dimethyl-5-benzylbarbituric acid; 2-methyl-1,3-indandione; and 1,5-diphenyl-3-[2(phenylthio)ethyl]-2,4-pyrrolidinedione.

8. A photosensitive element comprising a support bearing a layer of the composition of claim 1.

9. The photosensitive element of claim 8 wherein said support is a polymeric film.

10. A photosensitive element comprising a polyester film bearing a layer of the composition of claim 6 wherein said hydrogen- or electron-donor compound is 1,3,5-trimethylbarbituric acid.

11. The photosensitive element of claim 10 having a polypropylene cover sheet laminated to said layer.

12. The photosensitive element of claim 8 wherein said support is selected from metal or silicon.

* * * * *